United States Patent
Yao et al.

(10) Patent No.: US 7,181,825 B2
(45) Date of Patent: Feb. 27, 2007

(54) METHOD AND MECHANISM OF PZT MICRO-ACTUATOR ATTACHMENT FOR THE HARD DISK DRIVER ARM

(75) Inventors: Ming Gao Yao, Dongguan (CN); Masashi Shiraishi, Kowloon (HK); Yi Ru Xie, Dongguan (CN)

(73) Assignee: SAE Magnetics (H.K.) Ltd., Shatin (HK)

( * ) Notice: Subject to any disclaimer, the term of this patent is extended or adjusted under 35 U.S.C. 154(b) by 472 days.

(21) Appl. No.: 10/658,985

(22) Filed: Sep. 10, 2003

(65) Prior Publication Data

US 2004/0226165 A1 Nov. 18, 2004

(30) Foreign Application Priority Data

May 12, 2003 (WO) .................... PCT/CN03/00340

(51) Int. Cl.
 *G11B 5/127* (2006.01)
(52) U.S. Cl. ............... 29/603.07; 29/25.35; 29/603.03; 29/603.04; 29/603.06; 29/832; 29/729
(58) Field of Classification Search ............ 29/603.03, 29/25.35, 603.04, 603.06, 603.07, 832, 729; 360/290, 129, 234.4, 294.3, 294.4, 128; 264/255, 264/440, 439; 156/256, 89.16; 310/328, 310/366
 See application file for complete search history.

(56) References Cited

U.S. PATENT DOCUMENTS

| | | | | |
|---|---|---|---|---|
| 5,193,080 A | | 3/1993 | Mohri et al. ................. 369/244 |
| 5,233,260 A | * | 8/1993 | Harada et al. .............. 310/328 |
| 6,201,668 B1 | * | 3/2001 | Murphy .................... 360/294.4 |
| 6,301,080 B1 | * | 10/2001 | Boutaghou .................. 360/255 |
| 6,467,141 B2 | | 10/2002 | Okada et al. ............... 29/25.35 |
| 6,487,053 B1 | * | 11/2002 | Matsumura et al. ..... 360/265.7 |
| 2002/0141117 A1 | | 10/2002 | Kasajima et al. ......... 360/294.4 |
| 2002/0154450 A1 | | 10/2002 | Kasajima et al. ......... 360/294.4 |

FOREIGN PATENT DOCUMENTS

| | | |
|---|---|---|
| CN | 1085679 A | 4/1994 |
| CN | 1275229 T | 11/2000 |
| CN | 1354458 A | 6/2002 |
| JP | 2002-074870 | 3/2002 |
| JP | 2002-074871 | 3/2002 |
| JP | 2002-289936 | 10/2002 |

* cited by examiner

*Primary Examiner*—A. Dexter Tugbang
*Assistant Examiner*—Tai Van Nguyen
(74) *Attorney, Agent, or Firm*—Kenyon & Kenyon LLP

(57) ABSTRACT

A fixture with a shaped molding may hold a first micro-actuator part and a second micro-actuator part in place for coupling while maintaining the structure of the first micro-actuator part. The first micro-actuator part and the second micro-actuator part may be a frame or a strip of piezoelectric material. A vacuum nozzle system embedded in the fixture may hold the first micro-actuator part in place. A mobile vacuum nozzle system may hold the second micro-actuator in place and positions the second micro-actuator part relative to the first micro-actuator part. A camera system may monitor the process. A dispense may apply epoxy between the first and second micro-actuator part. An ultraviolet source may provide ultraviolet radiation for curing.

31 Claims, 9 Drawing Sheets

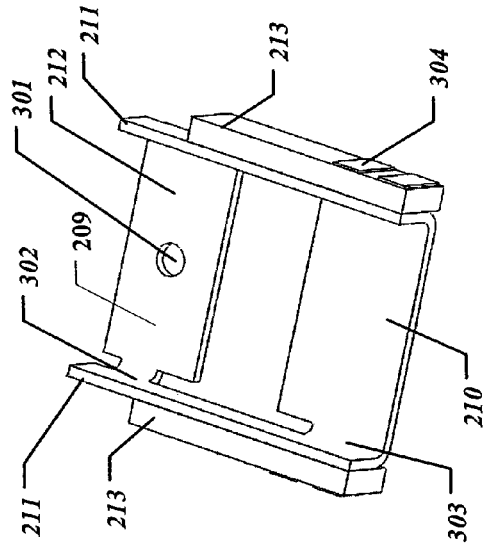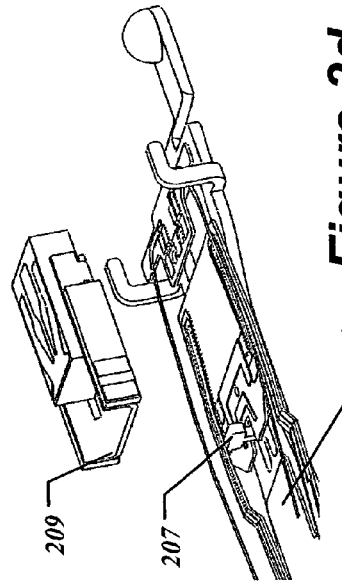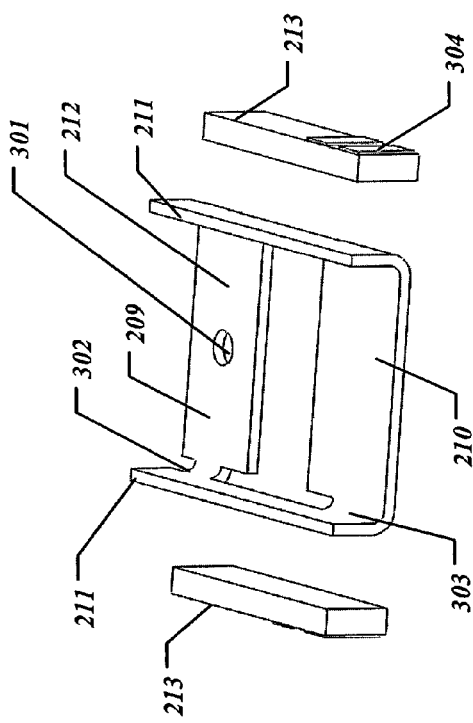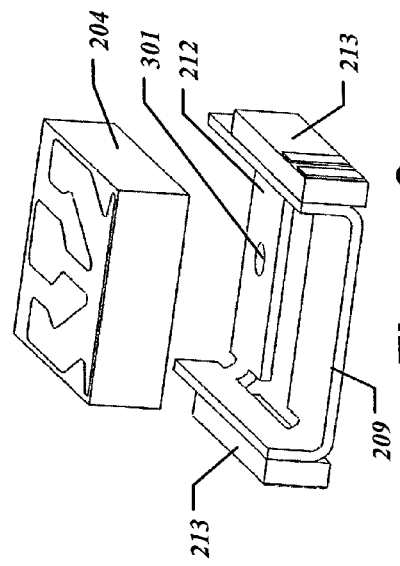

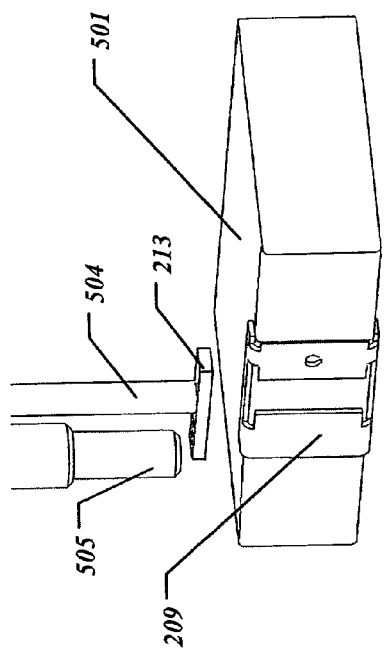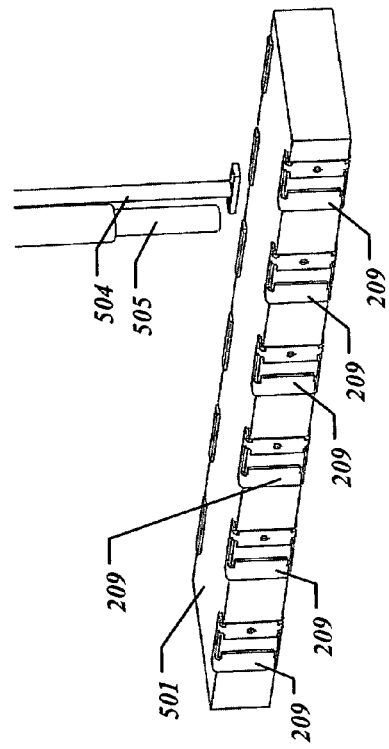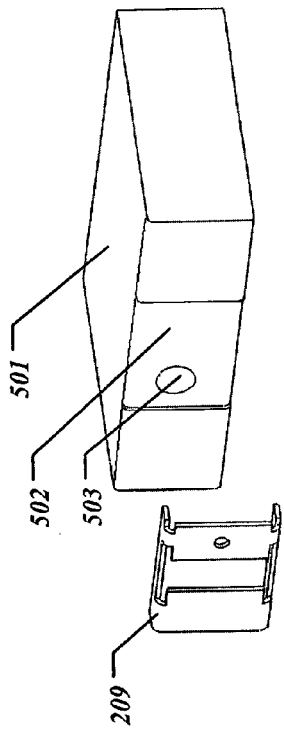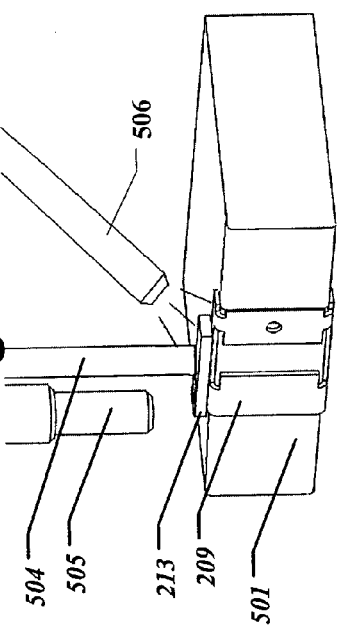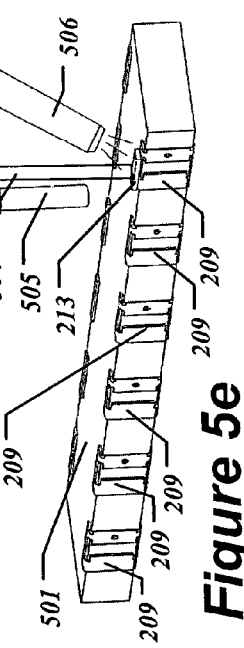

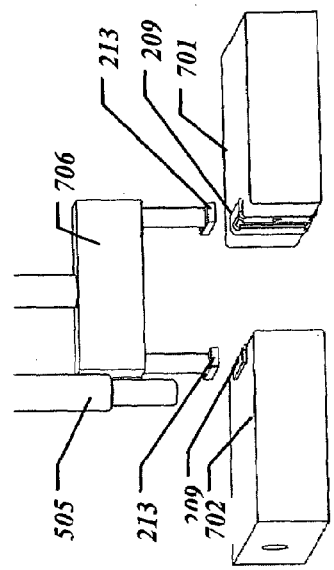
*Figure 7b*
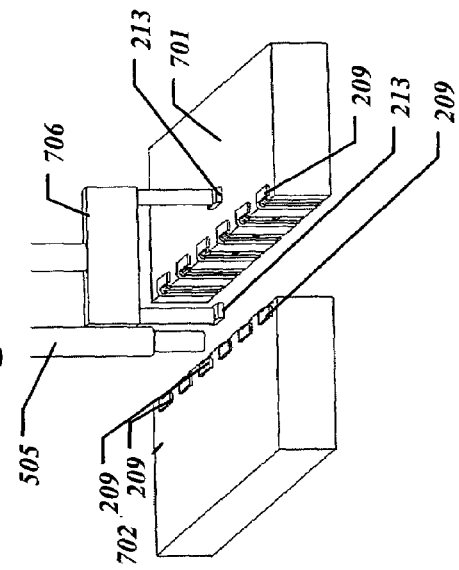
*Figure 7d*
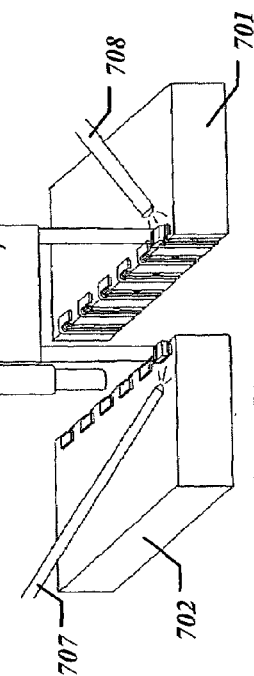
*Figure 7e*
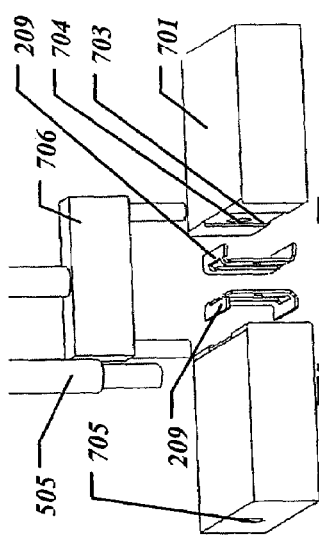
*Figure 7a*
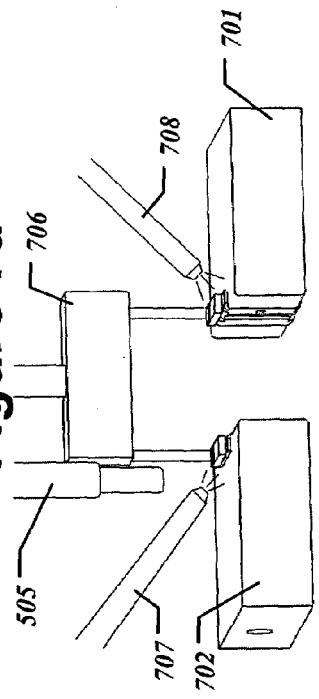
*Figure 7c*

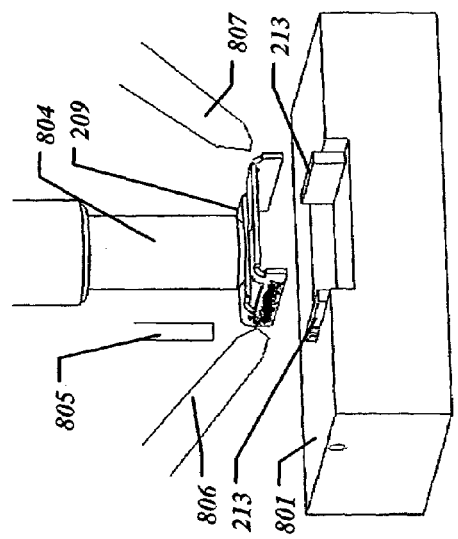
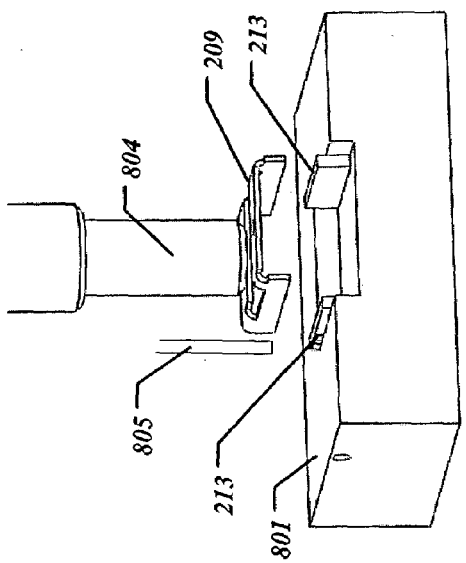
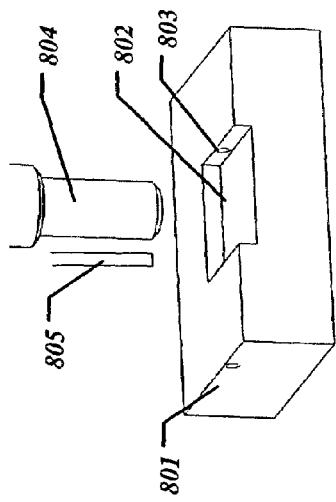
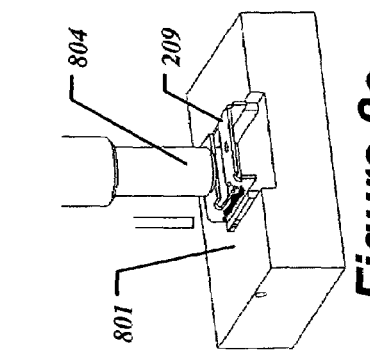
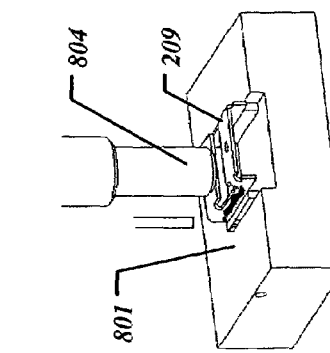
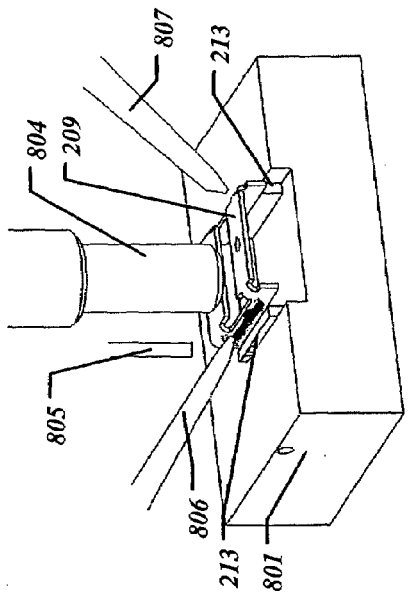

METHOD AND MECHANISM OF PZT MICRO-ACTUATOR ATTACHMENT FOR THE HARD DISK DRIVER ARM

BACKGROUND INFORMATION

The present invention relates to magnetic hard disk drives. More specifically, the present invention relates to a method of assembling micro-actuators.

In the art today, different methods are utilized to improve recording density of hard disk drives. FIG. 1 provides an illustration of a typical disk drive. The typical disk drive has a head gimbal assembly (HGA) configured to read from and write to a magnetic hard disk 101. The HGA and the magnetic hard disk 101 are mounted to the base 102 of a main board 103. The disk 101 is rotated relative to the base 102 by a spindle motor 104. The HGA typically includes an actuator arm 105 and a load beam 106. The HGA supports and positions a magnetic read/write slider 107 above the magnetic hard disk 101. The HGA is rotated relative to the base 102 along the axis of a bearing assembly 108 by a voice coil motor 109. A relay flexible printed circuit 110 connects a board unit 111 to the magnetic read/write slider 107.

FIGS. 2a–d provide an illustration of two embodiments of a piezoelectric micro-actuator. FIG. 2a illustrates a micro-actuator with a U-shaped ceramic frame configuration 201. The frame 201 may be Zirconia. The frame 201 may have two arms 202 opposite a base 203. A slider 204 may be held by the two arms 202 at the end opposite the base 203. A strip of piezoelectric material 205 may be attached to each arm 202. FIG. 2b illustrates the micro-actuator as attached to an actuator suspension 206. The micro-actuator may be coupled to a suspension tongue 207. Traces 208, coupled along the suspension 206, apply a voltage to the strips of piezoelectric material 205. These voltages may cause the strips 205 to contract and expand, moving the placement of the slider 204.

FIG. 2c illustrates an alternate version of the micro-actuator. In this embodiment, a metallic frame 209 has a base 210 with two arms 211 perpendicular to the plane of the base 210. A slider support 212 may hold the slider between the two arms 211. A strip of piezoelectric material 213 is coupled to each arm 211. The micro-actuator may then be attached to the head suspension 206 in the same manner as the ceramic micro-actuator, as shown in FIG. 2d.

One embodiment of a method of manufacturing the metallic frame 209 is shown in FIGS. 3a–d. The frame 209 may be stainless steel, such as SUS304. As shown in FIG. 3a, the two arms 211 of the metallic frame 209 may be formed using vertical forming by machine or laser. A hole 301 may be formed on the slider support 212 to facilitate the slider 204 mounting. The support connections 302 and the base connections 303 may be narrowed to improve resonance. The two strips of piezoelectric material 213 may each have at least one contact pad 304 attached that allows the strips 213 to be electrically coupled to a control circuit. As shown in FIG. 3b, the strips 213 may be coupled to the arms 211 of the metallic frame 209. As shown in FIG. 3c, the slider 204 may be coupled to the slider support 212. The slider 204 may be coupled using epoxy or some other kind of adhesive. The epoxy may be cured using the hole 301 in the slider support 212. As shown in FIG. 3d, the micro-actuator may then be attached to the suspension tongue 207.

FIGS. 4a–b provides an illustration in a pair of charts of the effect of adhesive thickness on stroke and resonance. FIG. 4a compares the stroke in micrometers to the adhesive thickness in millimeters. In this example, stroke pertains to the amount of deflection of the slider caused by the micro-actuator. FIG. 4b compares the resonance frequency of the micro-actuator in kilohertz to the adhesive thickness in millimeters. Due to the small size of the micro-actuators and the fragile nature of the piezoelectric material, stress fractures and distortions remain problems.

BRIEF DESCRIPTION OF THE DRAWINGS

FIGS. 3a–d provide an illustration of one embodiment of a method of manufacturing the metallic frame.

FIGS. 5a–e provide an illustration of one embodiment of a method for attaching the strips of piezoelectric material to the metallic frame.

FIGS. 8a–f provide an illustration of an alternate embodiment of a method for attaching the strips of piezoelectric material to the metallic frame.

DETAILED DESCRIPTION

Figure 1:
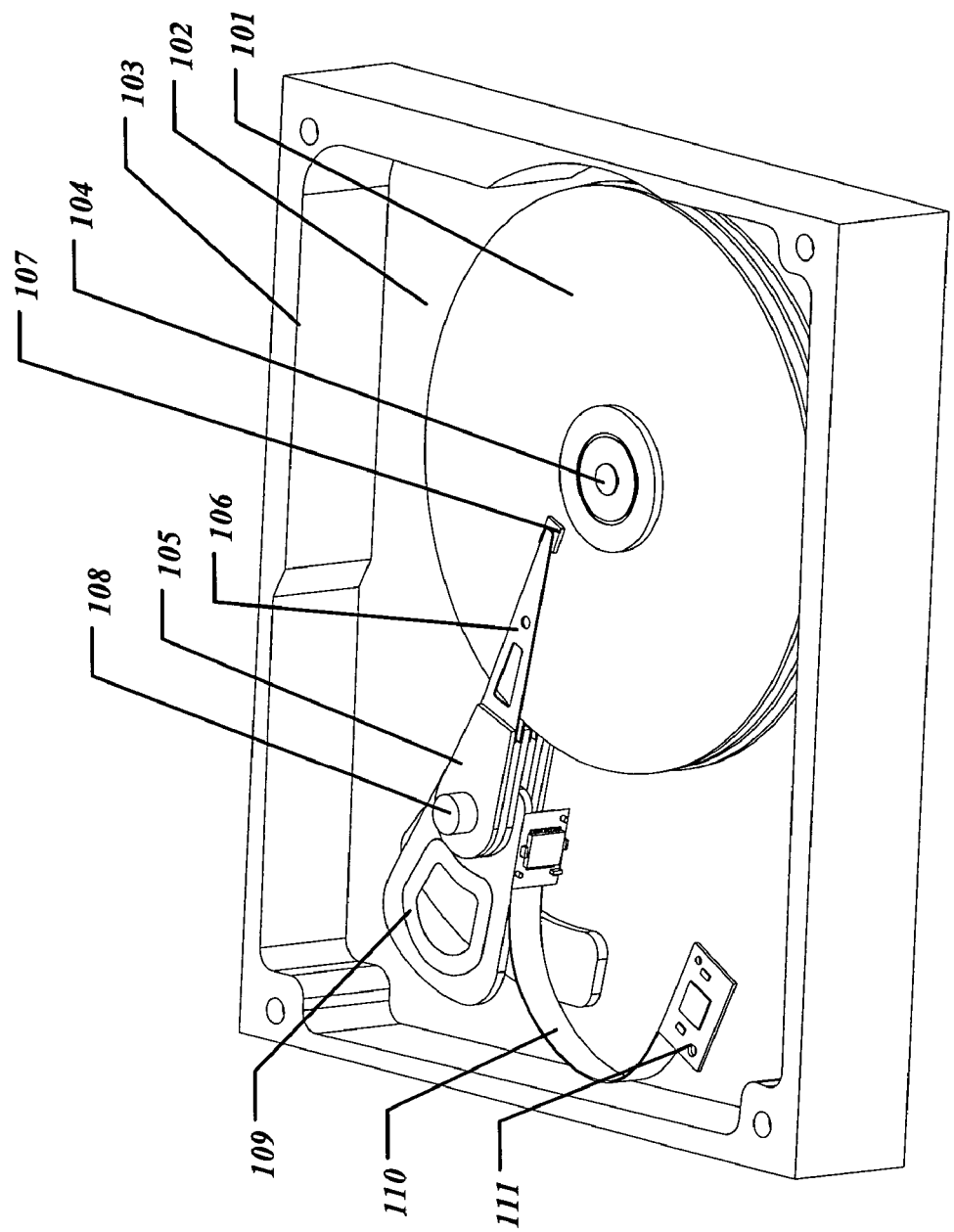
FIG. 1 provides an illustration of a typical disk drive.
Figure 2B:
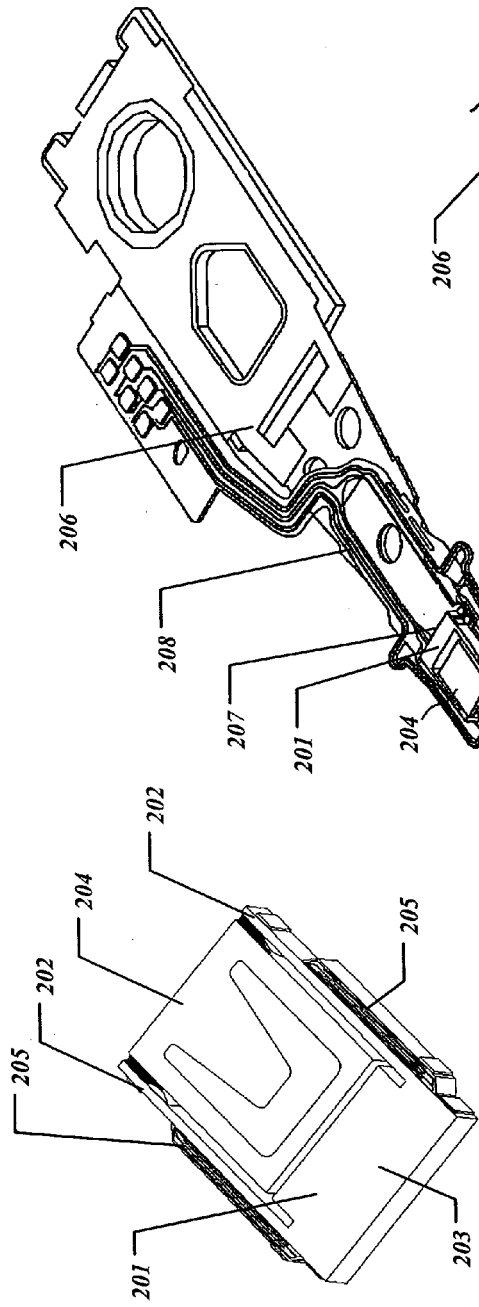
FIGS. 2a–d provide an illustration of two embodiments of a piezoelectric micro-actuator.
Figure 2D:
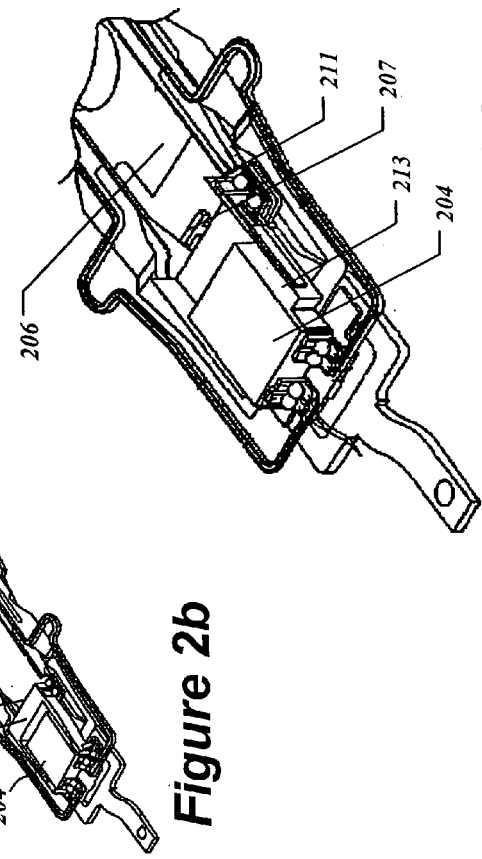
Figure 2A:
Figure 2C:
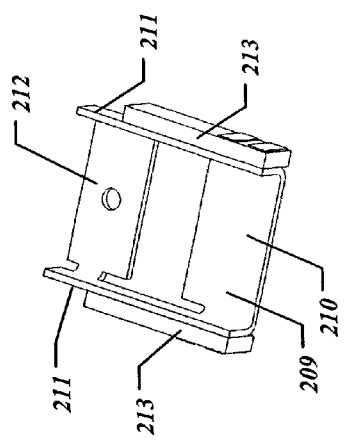
Figure 4B:
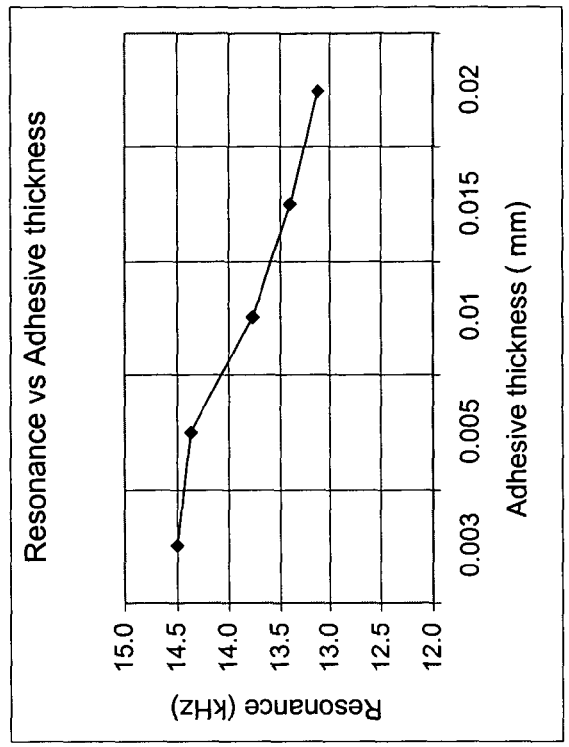
FIGS. 4a–b provide an illustration in a pair of charts of the effect of adhesive thickness on stroke and resonance.
Figure 4A:
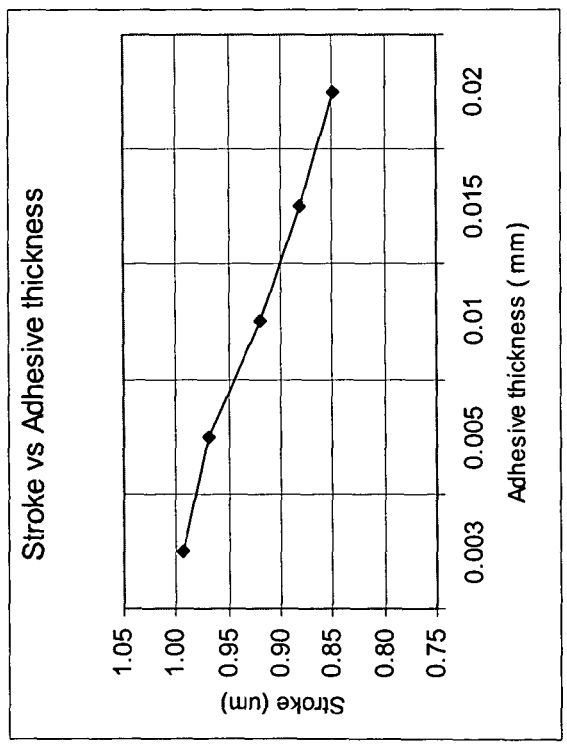

A fixture with a shaped molding may hold a first micro-actuator part and a second micro-actuator part in place for coupling while maintaining the structure of the first micro-actuator part. The first micro-actuator part and the second micro-actuator part may be a frame or a strip of piezoelectric material. A vacuum nozzle system embedded in the fixture may hold the first micro-actuator part in place. A mobile vacuum nozzle system may hold the second micro-actuator in place and positions the second micro-actuator part relative to the first micro-actuator part. A camera system may monitor the process. A dispenser may apply epoxy between the first and second micro-actuator part. An ultraviolet source may provide ultraviolet radiation for curing.

FIGS. 5a–e illustrate one embodiment of a method for attaching the strips of piezoelectric material 213 to the metallic frame 209. As shown in FIG. 5a, the metallic frame 209 may be placed on a fixture 501 to maintain the structure of the metallic frame 209 while the strips of piezoelectric material 213 are added. The fixture 501 may have a shaped indentation 502 to match the exterior of the metallic frame 209. Alternately, the fixture 501 may have a shaped protrusion that matches the interior of the metallic frame 209. A vacuum nozzle 503 embedded within the fixture 501 may hold the metallic frame 209 in place on the fixture 501. The base 210 may be placed on the vacuum nozzle 503. As shown in FIG. 5b, a strip of piezoelectric material 213 may be held aloft by a mobile vacuum nozzle 504. The mobile vacuum nozzle 504 may be moved in all three dimensions and is rotatable along the axis of the nozzle 504. A camera system 505 may be used to monitor the placement of the strip of piezoelectric material 213. A dispenser places adhesive on the metallic frame 209. In one embodiment, the adhesive is epoxy. As shown in FIG. 5c, the mobile vacuum nozzle 504 may place the strip of piezoelectric material 213 against the metallic frame 209. An ultraviolet source 506 may be used to cure the epoxy bond between the strip of piezoelectric material 213 and the metallic frame 209. After a time delay of 3–9 seconds, the ultraviolet source 506 is turned off and the mobile vacuum nozzle 504 is removed. In an alternate embodiment, the mobile vacuum nozzle 504 is removed and the ultraviolet source 506 is turned off. In an alternative embodiment illustrated in FIG. 5d, the fixture 501 may maintain the structure of multiple metallic frames 209. The mobile vacuum nozzle 504 may place the strip of piezoelectric material 213 against the arm 211 of the first metallic frame 209. As shown in FIG. 5e, the ultraviolet source 506 may then cure the epoxy bond before moving to the next metallic frame 209.

Figure 6:
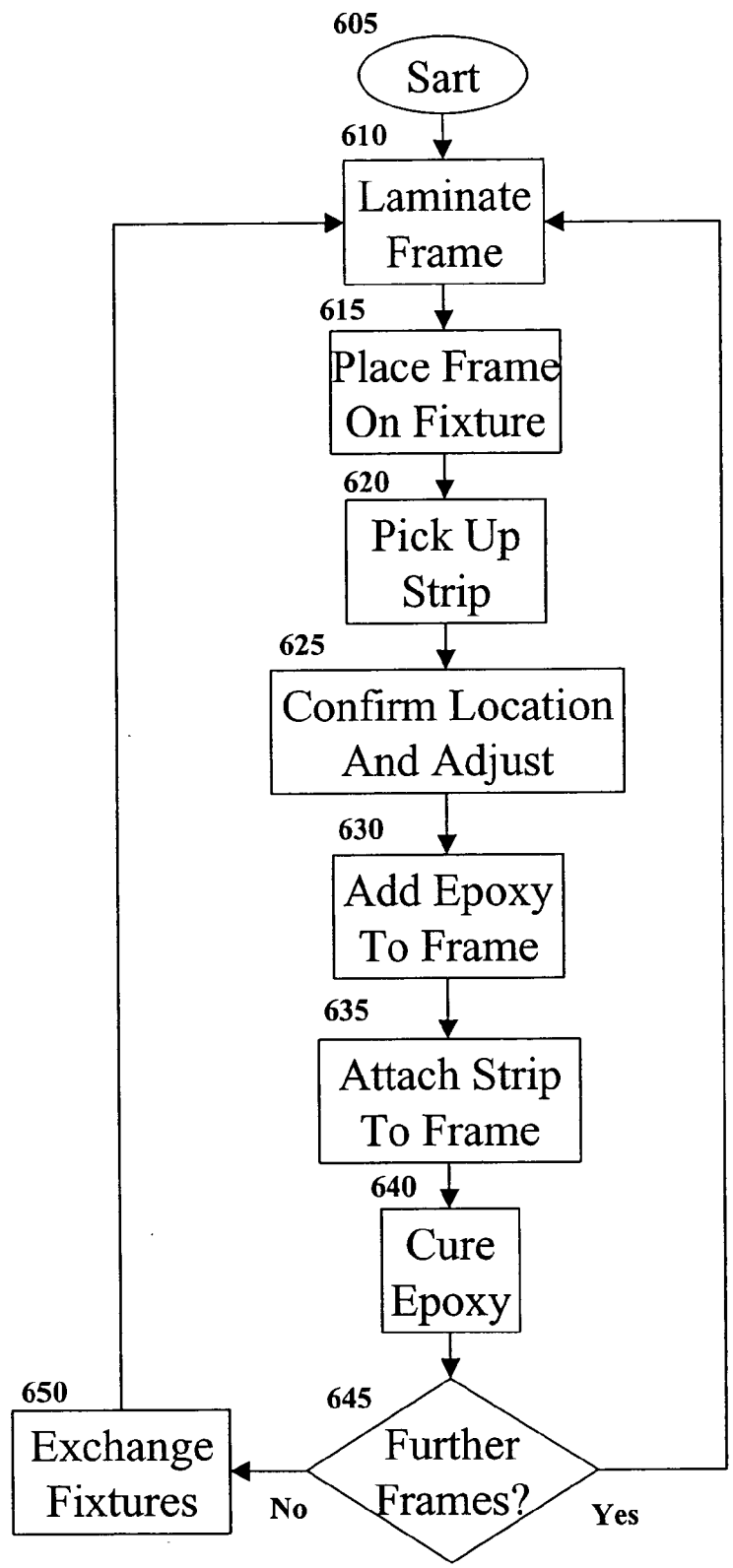
FIG. 6 provides an illustration in a flowchart of one embodiment of a method for using the fixture FIGS. 7a–e provide an illustration of an alternate embodiment of a method for attaching the strips of piezoelectric material to multiple metallic frames.

One embodiment of a method for using the fixture of FIGS. 5d–e is illustrated in the flowchart of FIG. 6. To start (Block 605), the frame 209 may be laminated (Block 610). The frame 209 may be placed upon the fixture 501 (Block 615). The strip of piezoelectric material 213 may be picked up by the mobile vacuum nozzle 504 (Block 620). The location of the strip of piezoelectric material 213 may be confirmed and then adjustments are made as necessary (Block 625). Epoxy may be added to the frame 209 (Block 630). The strip of piezoelectric material 213 may be attached to the frame 209 (Block 635). The epoxy is cured by ultraviolet radiation (Block 640). A camera system 505 may confirm if further frames 209 are on the fixture 501 (Block 645). If further frames 209 are not on the fixture 501, the fixture 501 is exchanged (Block 650). Otherwise, the next frame is worked on (Block 610).

FIGS. 7a–e illustrate an alternate embodiment of a method for attaching the strips of piezoelectric material 213 to multiple metallic frames 209. As shown in FIG. 7a, a first metallic frame 209 is placed on a first fixture 701 and a second metallic frame 209 is placed on the second fixture 702 to maintain the structure of the metallic frames 209 while the strips of piezoelectric material 213 are added. The first fixture 701 and the second fixture 702 may have shaped indentations 703 to match the exterior of the metallic frame 209. Alternately, the first fixture 701 and the second fixture 702 may have a shaped protrusion that matches the interior of the metallic frame 209. A first vacuum nozzle 704 embedded within the first fixture 701 may hold a metallic frame 209 in place on the first fixture 701 and a second vacuum nozzle 705 embedded within the first fixture 702 may hold a metallic frame 209 in place on the second fixture 702. As shown in FIG. 7b, two strips of piezoelectric material 213 may be held aloft by a mobile dual vacuum nozzle 706. The mobile dual vacuum nozzle 706 may be moved in all three dimensions. A camera system 505 may be used to monitor the placement of the strip of piezoelectric material 213. A dispenser places adhesive on the metallic frame 209. In one embodiment, the adhesive is epoxy. As shown in FIG. 7c, the mobile dual vacuum nozzle 706 may place the strips of piezoelectric material 213 against the metallic frames 209. A first ultraviolet source 707 and a second ultraviolet source 708 may be used to cure the epoxy bonds between the strips of piezoelectric material 213 and the metallic frames 209. After a time delay of 3–9 seconds, the mobile dual vacuum nozzle 706 is removed and the first ultraviolet source 707 and the second ultraviolet source 708 are turned off. In an alternative embodiment illustrated in FIG. 7d, the first fixture 701 and the second fixture 702 may each maintain the structure of multiple metallic frames 209. The mobile dual vacuum nozzle 706 may place the strip of piezoelectric material 213 against the arm 211 of a first and second metallic frame 209. As shown in FIG. 7e, the first ultraviolet source 707 and the second ultraviolet source 708 may then cure the epoxy bond before moving to the next two metallic frames 209.

FIGS. 8a–f illustrate an alternate embodiment of a method for attaching the strips of piezoelectric material 213 to the metallic frame 209. As shown in FIG. 8a, the two strips of piezoelectric material 213 may be placed on the fixture 801. The fixture 801 may have a shaped indentation 802 to match the exterior of the metallic frame 209 and the two strips of piezoelectric material 213. A vacuum nozzle system 803 embedded within the fixture 501 may hold the two strips of piezoelectric material 213 in place on the fixture 801. As shown in FIG. 8b, a frame 209 may be held aloft by a mobile vacuum nozzle 804, with the arms oriented downward. The mobile vacuum nozzle 804 may be moved in all three dimensions and is rotatable along the axis of the nozzle 804. A camera system 805 may be used to monitor the placement of the frame 209. As shown in FIG. 8c, a first dispenser 806 and a second dispenser 807 may place adhesive on the metallic frame 209. In one embodiment, the adhesive is epoxy. As shown in FIG. 8d, the mobile vacuum nozzle 804 may move about to spread the epoxy evenly on the frame 209. As shown in FIG. 8e, the mobile vacuum nozzle 804 may place the metallic frame 209 against the strip of piezoelectric material 213. As shown in FIG. 8f, a first ultraviolet source 808 and a second ultraviolet source 809 may be used to cure the epoxy bond between the strip of piezoelectric material 213 and the metallic frame 209. After a time delay of 3–9 seconds, the mobile vacuum nozzle 804 may be removed after the first ultraviolet source 808 and the second ultraviolet source 809 are turned off. In an alternate embodiment, the mobile vacuum nozzle 804 may be removed before the first ultraviolet source 808 and the second ultraviolet source 809 are turned off.

Figure 9B:
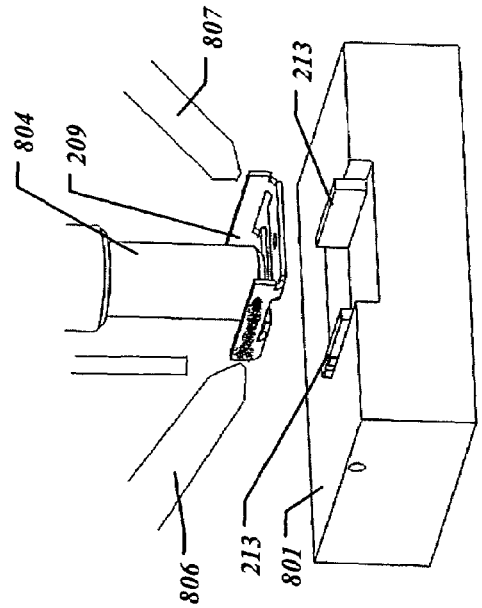
FIGS. 9a–e provide an illustration of an alternate embodiment of a method for attaching the strips of piezoelectric material to the metallic frame.
Figure 9A:
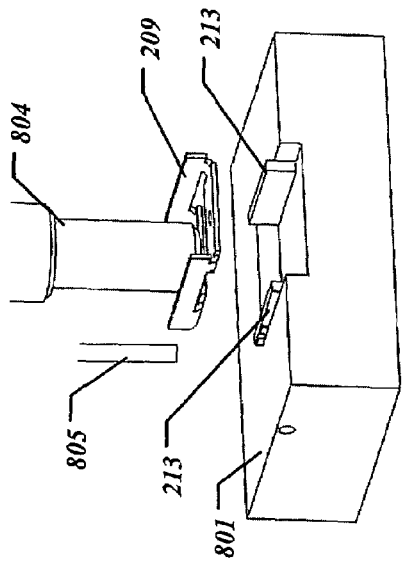
Figure 9D:
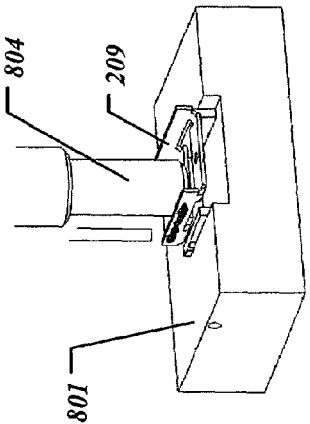
Figure 9C:
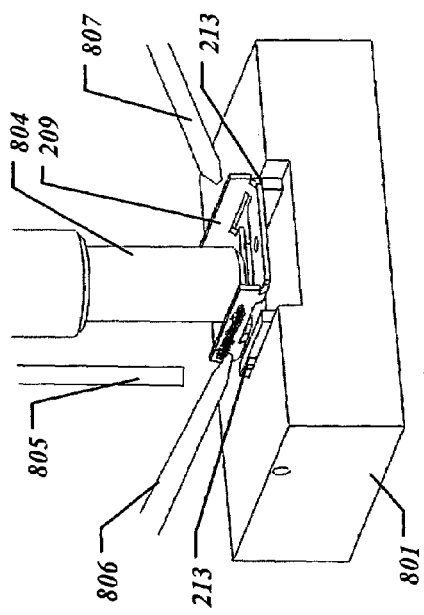
Figure 9E:
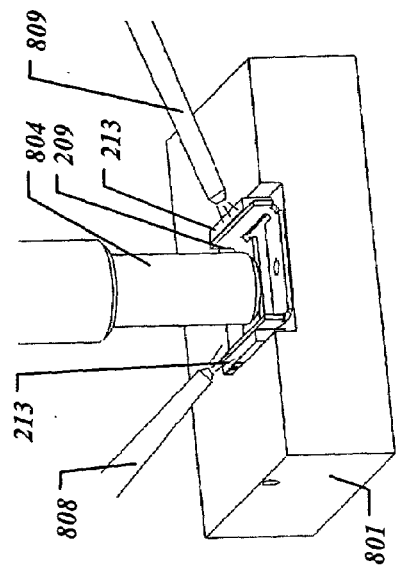

FIGS. 9a–e illustrate an alternate embodiment of a method for attaching the strips of piezoelectric material 213 to the metallic frame 209. As shown in FIG. 9a, the two strips of piezoelectric material 213 may be placed on the fixture 801. The fixture 801 may have a shaped indentation 802 to match the exterior of the metallic frame 209 and the two strips of piezoelectric material 213. A vacuum nozzle system 803 embedded within the fixture 501 may hold the two strips of piezoelectric material 213 in place on the fixture 801. A frame 209 may be held aloft by a mobile vacuum nozzle 804, with the arms oriented upward. The mobile vacuum nozzle 804 may be moved in all three dimensions and is rotatable along the axis of the nozzle 804. A camera system 805 may be used to monitor the placement of the frame 209. As shown in FIG. 9b, a first dispenser 806 and a second dispenser 807 may place adhesive on the metallic frame 209. In one embodiment, the adhesive is epoxy. As shown in FIG. 9c, the mobile vacuum nozzle 804 may move about to spread the epoxy evenly on the frame 209. As shown in FIG. 9d, the mobile vacuum nozzle 804 may place the metallic frame 209 against the strip of piezoelectric material 213. As shown in FIG. 9e, a first ultraviolet source 808 and a second ultraviolet source 809 may be used to cure the epoxy bond between the strip of piezoelectric material 213 and the metallic frame 209. After a time delay of 3–9 seconds, the mobile vacuum nozzle 804 may be removed after the first ultraviolet source 808 and the second ultraviolet source 809 may be turned off. In an alternate embodiment, the mobile vacuum nozzle 804 may be removed before the first ultraviolet source 808 and the second ultraviolet source 809 are turned off.

Although several embodiments are specifically illustrated and described herein, it will be appreciated that modifications and variations of the present invention are covered by the above teachings and within the purview of the appended claims without departing from the spirit and intended scope of the invention.

The invention claimed:

1. A method, comprising:
   placing a first micro-actuator part in a molding of a fixture;
   coupling a second micro-actuator part to the first micro-actuator part; and
   using the fixture to maintain a structure of the first micro-actuator part and the second micro-actuator part wherein the first micro-actuator part is a micro-actuator frame and wherein the molding is a shaped protrusion that matches the interior of the first micro-actuator frame.

2. The method of claim 1, further comprising holding the first micro-actuator part in place with an embedded vacuum nozzle system.

3. The method of claim 1, further comprising positioning the second micro-actuator part relative to the first micro-actuator part for coupling using a first mobile vacuum nozzle system.

4. The method of claim 1, wherein the micro-actuator frame is metal.

5. The method of claim 1, wherein the second micro-actuator part is a first strip of piezoelectric material.

6. The method of claim 5, further comprising positioning a second strip of piezoelectric material with a second mobile vacuum nozzle system.

7. The method of claim 5, further comprising holding a second strip of piezoelectric material with the first mobile vacuum nozzle system.

8. The method of claim 1, wherein the second micro-actuator part is a micro-actuator frame.

9. The method of claim 8, wherein the micro-actuator frame is metal.

10. The method of claim 1, further comprising maintaining the structure of multiple frames simultaneously with multiple moldings.

11. The method of claim 1, further comprising observing the fixture with a camera system.

12. The method of claim 1, further comprising curing the adhesive is cured with ultraviolet radiation.

13. A method, comprising:
    placing a first micro-actuator part in a molding of a fixture;
    coupling a second micro-actuator part to the first micro-actuator part; and
    using the fixture to maintain a structure of the first micro-actuator part and the second micro-actuator part wherein the molding is a shaped indentation that matches the exterior of the first micro-actuator part, the second micro-actuator part, and a third micro-actuator part.

14. The method of claim 13, further comprising holding the first micro-actuator part in place with an embedded vacuum nozzle system.

15. The method of claim 13, further comprising positioning the second micro-actuator part relative to the first micro-actuator part for coupling using a first mobile vacuum nozzle system.

16. The method of claim 13, wherein the second micro-actuator part is a first strip of piezoelectric material.

17. The method of claim 13, wherein the first micro-actuator part is a first strip of piezoelectric material and the third micro-actuator part is a second strip of piezoelectric material.

18. The method of claim 13, wherein the second micro-actuator part is a micro-actuator frame.

19. The method of claim 18, wherein the micro-actuator frame is metal.

20. The method of claim 13, further comprising maintaining the structure of multiple frames simultaneously with multiple moldings.

21. The method of claim 13, further comprising observing the fixture with a camera system.

22. A method, comprising:
    placing a first micro-actuator part in a molding of a fixture;
    coupling a second micro-actuator part to the first micro-actuator part; and
    using the fixture to maintain a structure of the first micro-actuator part and the second micro-actuator part further comprising applying an adhesive between the first micro-actuator part and the second micro-actuator part.

23. The method of claim 22, further comprising holding the first micro-actuator part in place with an embedded vacuum nozzle system.

24. The method of claim 22, further comprising positioning the second micro-actuator part relative to the first micro-actuator part for coupling using a first mobile vacuum nozzle system.

25. The method of claim 22, wherein the second micro-actuator part is a first strip of piezoelectric material.

26. The method of claim 25, further comprising positioning a second strip of piezoelectric material with a second mobile vacuum nozzle system.

27. The method of claim 22, further comprising holding a second strip of piezoelectric material wit the first mobile vacuum nozzle system.

28. The method of claim 22, wherein the second micro-actuator part is a micro-actuator frame.

29. The method of claim 22, wherein the micro-actuator frame is metal.

30. The method of claim 22, further comprising maintaining the structure of multiple frames simultaneously with multiple moldings.

31. The method of claim 22, further comprising observing the fixture with a camera system.

* * * * *